US012638329B2

(12) United States Patent (10) Patent No.: US 12,638,329 B2
Antin et al. (45) Date of Patent: May 26, 2026

(54) TESTING AN ARC DETECTING SYSTEM

(71) Applicant: ABB Schweiz AG, Baden (CH)

(72) Inventors: Jan-Peter Antin, Västerås (SE); Mats Åslund, Hallstahammar (SE); Emma Thelin, Uppsala (SE); Johnnie Blom, Västerås (SE)

(73) Assignee: ABB Schweiz AG, Baden (CH)

( * ) Notice: Subject to any disclaimer, the term of this patent is extended or adjusted under 35 U.S.C. 154(b) by 167 days.

(21) Appl. No.: 18/574,100

(22) PCT Filed: May 13, 2022

(86) PCT No.: PCT/EP2022/063006

§ 371 (c)(1),
(2) Date: Dec. 26, 2023

(87) PCT Pub. No.: WO2023/274615

PCT Pub. Date: Jan. 5, 2023

(65) Prior Publication Data

US 2024/0319004 A1 Sep. 26, 2024

(30) Foreign Application Priority Data

Jun. 29, 2021 (EP) ..................................... 21182280

(51) Int. Cl.
G01J 1/08 (2006.01)
G01J 1/42 (2006.01)
(Continued)

(52) U.S. Cl.
CPC ........... G01J 1/08 (2013.01); G01J 2001/083 (2013.01); G01J 1/42 (2013.01);
(Continued)

(58) Field of Classification Search
CPC .......... G01J 1/08; G01J 1/42; G01J 2001/083; G01J 2001/4238; G01R 31/1218; H02H 1/0023
(Continued)

(56) References Cited

U.S. PATENT DOCUMENTS 5,986,860 A 11/1999 Scott
6,229,680 B1 5/2001 Shea
(Continued)

FOREIGN PATENT DOCUMENTS

CA 2936126 C 7/2020
CN 105910649 A 8/2016
(Continued)

OTHER PUBLICATIONS

Indian First Office Action; Application No. 202347089324; Mailing Date: May 7, 2025; 8 Pages.
(Continued)

*Primary Examiner* — Michelle M Iacoletti
*Assistant Examiner* — Noah J. Haney
(74) *Attorney, Agent, or Firm* — Whitmyer IP Group LLC

(57) ABSTRACT

A testing arrangement is provided for an arc detecting system that includes at least one optical detector at a piece of electric equipment, where the testing arrangement includes at least one light source and a testing unit, where the testing unit is configured to control the light source to emit a test light to the optical detector with steps of increasing luminance starting from a minimum test level and continuing towards a maximum test level, investigate if the optical detector detects the emitted test light and determine that the arc detecting system is operational if the optical detector is able to detect the test light at any of the used test levels.

17 Claims, 5 Drawing Sheets

(51) Int. Cl.
 *G01R 31/12* (2020.01)
 *H02H 1/00* (2006.01)
(52) U.S. Cl.
 CPC ... *G01J 2001/4238* (2013.01); *G01R 31/1218*
 (2013.01); *H02H 1/0023* (2013.01)
(58) Field of Classification Search
 USPC ...................................................... 356/243.1
 See application file for complete search history.

(56) References Cited

U.S. PATENT DOCUMENTS

| | | | |
|---|---|---|---|
| 6,255,829 B1 | 7/2001 | Eriksson | |
| 6,518,772 B1 | 2/2003 | Milkovic et al. | |
| 6,617,859 B1 | 9/2003 | Orton | |
| 6,657,150 B1 | 12/2003 | Shea et al. | |
| 6,693,438 B2 | 2/2004 | Shea | |
| 6,894,301 B2 * | 5/2005 | Furukawa ............. | G01R 31/308 |
| | | | 250/559.4 |
| 6,909,977 B2 | 6/2005 | Orton | |
| 6,930,491 B2 | 8/2005 | Gregory et al. | |
| 7,035,068 B2 | 4/2006 | Shea | |
| 7,142,291 B2 | 11/2006 | Sarkozi et al. | |
| 7,154,279 B2 | 12/2006 | Gregory et al. | |
| 7,579,581 B2 | 8/2009 | Aiello et al. | |
| 7,580,232 B2 | 8/2009 | Caggiano et al. | |
| 7,668,412 B2 | 2/2010 | Lee et al. | |
| 7,787,113 B2 | 8/2010 | Aiello et al. | |
| 7,791,846 B2 | 9/2010 | Roscoe et al. | |
| 7,821,749 B2 | 10/2010 | Asokan et al. | |
| 7,929,260 B2 | 4/2011 | Roscoe et al. | |
| 7,952,362 B2 | 5/2011 | Baldauf et al. | |
| 8,040,517 B1 | 10/2011 | Wu et al. | |
| 8,054,594 B2 | 11/2011 | Wu et al. | |
| 8,154,730 B2 | 4/2012 | Wu et al. | |
| 8,223,466 B2 | 7/2012 | Roscoe | |
| 8,319,173 B2 | 11/2012 | Schweitzer et al. | |
| 8,319,182 B1 | 11/2012 | Brady et al. | |
| 8,335,063 B2 | 12/2012 | Hooker et al. | |
| 8,451,572 B2 | 5/2013 | Schweitzer, III | |
| 8,466,690 B2 | 6/2013 | Stewart et al. | |
| 8,564,915 B2 | 10/2013 | Roscoe et al. | |
| 8,593,769 B2 | 11/2013 | Schweitzer | |
| 8,664,961 B2 | 3/2014 | Zeller et al. | |
| 8,675,329 B2 | 3/2014 | Schweitzer, III | |
| 8,735,798 B2 | 5/2014 | Kesler et al. | |
| 8,803,069 B2 | 8/2014 | Kesler et al. | |
| 8,847,606 B2 | 9/2014 | White et al. | |
| 9,046,391 B2 | 6/2015 | Schweitzer, III et al. | |
| 9,088,149 B2 | 7/2015 | Carroll | |
| 9,172,222 B2 | 10/2015 | Bozek et al. | |
| 9,291,494 B1 | 3/2016 | Piesinger | |
| 9,324,527 B2 | 4/2016 | Allalouf et al. | |
| 9,390,067 B2 | 7/2016 | Garnacho Vecino et al. | |
| 9,407,082 B2 | 8/2016 | Lagree et al. | |
| 9,413,155 B2 | 8/2016 | Blemel et al. | |
| 9,482,699 B2 | 11/2016 | Hoffman et al. | |
| 9,502,880 B2 | 11/2016 | Carroll | |
| 9,515,475 B2 | 12/2016 | Kesler et al. | |
| 9,581,646 B2 | 2/2017 | Lefeber | |
| 9,651,601 B2 | 5/2017 | Stechemesser | |
| 9,653,904 B2 | 5/2017 | Schweitzer et al. | |
| 9,753,080 B2 | 9/2017 | Andle et al. | |
| 9,825,452 B2 | 11/2017 | Holmgaard et al. | |
| 9,829,531 B2 | 11/2017 | Alini et al. | |
| 9,837,809 B2 | 12/2017 | Chae et al. | |
| 9,838,228 B2 | 12/2017 | Choi et al. | |
| 9,952,272 B2 | 4/2018 | Chawla et al. | |
| 9,976,989 B2 | 5/2018 | Dehghan Niri et al. | |
| 9,977,069 B2 | 5/2018 | Ohtsuka et al. | |
| 10,120,014 B2 | 11/2018 | Nikic et al. | |
| 10,197,615 B2 | 2/2019 | Di Stefano et al. | |
| 10,224,706 B2 | 3/2019 | Kreekon | |
| 10,330,720 B2 | 6/2019 | Nikic et al. | |
| 10,476,251 B2 | 11/2019 | Heidmann et al. | |
| 10,534,031 B2 | 1/2020 | Godfrey et al. | |
| 10,551,424 B2 | 2/2020 | Wangemann et al. | |
| 2003/0214307 A1 | 11/2003 | Kang et al. | |
| 2007/0279071 A1 | 12/2007 | Orton | |
| 2010/0072355 A1 | 3/2010 | Schweitzer et al. | |
| 2011/0267598 A1 | 11/2011 | Hjort et al. | |
| 2014/0043714 A1 | 2/2014 | Benke | |
| 2017/0138999 A1 | 5/2017 | Kim | |
| 2018/0106852 A1 | 4/2018 | Eigner et al. | |
| 2019/0118671 A1 | 4/2019 | Helnerus et al. | |
| 2020/0119538 A1 | 4/2020 | Johnson | |
| 2020/0150184 A1 | 5/2020 | Yu-Ming Chao et al. | |
| 2020/0209288 A1 | 7/2020 | Karin et al. | |
| 2020/0209301 A1 | 7/2020 | Karin et al. | |

FOREIGN PATENT DOCUMENTS

| | | | | | |
|---|---|---|---|---|---|
| CN | 205581232 U | * | 9/2016 | ............. | G01R 31/00 |
| CN | 106405345 A | | 2/2017 | | |
| CN | 206117107 U | | 4/2017 | | |
| CN | 106970307 A | | 7/2017 | | |
| CN | 206645622 U | | 11/2017 | | |
| CN | 107942215 A | | 4/2018 | | |
| CN | 108318793 A | | 7/2018 | | |
| CN | 108445369 A | | 8/2018 | | |
| CN | 108459250 A | | 8/2018 | | |
| CN | 108645513 A | * | 10/2018 | ................ | G01J 1/08 |
| CN | 208092185 U | | 11/2018 | | |
| CN | 108963957 A | * | 12/2018 | ............. | H02H 7/222 |
| CN | 106093720 B | | 2/2019 | | |
| CN | 109342907 A | | 2/2019 | | |
| CN | 109669062 A | | 4/2019 | | |
| CN | 109683068 A | | 4/2019 | | |
| CN | 109696607 A | | 4/2019 | | |
| CN | 109842086 A | * | 6/2019 | ............... | H02H 7/22 |
| CN | 108110736 B | | 7/2019 | | |
| CN | 110275094 A | | 9/2019 | | |
| CN | 110470955 A | | 11/2019 | | |
| CN | 110618368 A | | 12/2019 | | |
| CN | 110879336 A | | 3/2020 | | |
| CN | 111123056 A | | 5/2020 | | |
| CN | 110161390 B | | 6/2020 | | |
| CN | 111220882 A | | 6/2020 | | |
| CN | 111308289 A | | 6/2020 | | |
| CN | 111537847 A | | 8/2020 | | |
| CN | 106911118 B | | 10/2020 | | |
| CN | 107037328 B | | 11/2020 | | |
| DE | 3232956 A1 | | 3/1984 | | |
| DE | 4440281 A1 | * | 5/1996 | ........... | H02B 13/065 |
| DE | 102013104155 B4 | | 9/2015 | | |
| DE | 102014211850 A1 | | 12/2015 | | |
| DE | 102015010930 A1 | | 3/2016 | | |
| DE | 102016200801 A1 | | 8/2016 | | |
| DE | 102015207802 A1 | | 11/2016 | | |
| DE | 212014000258 U1 | | 3/2017 | | |
| DE | 102015202597 B4 | | 9/2017 | | |
| DE | 102017206354 A1 | | 10/2018 | | |
| DE | 102017208851 B4 | | 3/2019 | | |
| DE | 102018100244 A1 | | 7/2019 | | |
| DE | 102018124218 A1 | | 4/2020 | | |
| DE | 102019104742 A1 | | 8/2020 | | |
| EP | 1293023 A1 | | 3/2003 | | |
| EP | 1133701 B1 | | 6/2005 | | |
| EP | 1057233 B1 | | 5/2006 | | |
| EP | 1514287 B1 | | 5/2006 | | |
| EP | 1077518 B1 | | 6/2006 | | |
| EP | 1252529 B1 | | 11/2007 | | |
| EP | 1924865 B1 | | 3/2010 | | |
| EP | 2199999 A1 | * | 6/2010 | ........... | G08B 13/189 |
| EP | 1938116 B1 | | 9/2010 | | |
| EP | 2472275 A2 | | 7/2012 | | |
| EP | 1335466 B1 | | 4/2013 | | |
| EP | 1538722 B1 | | 4/2013 | | |
| EP | 2383855 B1 | | 8/2013 | | |
| EP | 1976077 B1 | | 9/2014 | | |
| EP | 2018699 B1 | | 9/2014 | | |
| EP | 2031727 B1 | | 10/2014 | | |
| EP | 2538511 B1 | | 4/2015 | | |
| EP | 2329577 B1 | | 1/2016 | | |

(56)  References Cited

FOREIGN PATENT DOCUMENTS

| | | | |
|---|---|---|---|
| EP | 2329576 | B1 | 3/2016 |
| EP | 2149953 | B1 | 6/2016 |
| EP | 3030913 | A1 | 6/2016 |
| EP | 3109958 | A1 | 12/2016 |
| EP | 2904413 | B1 | 1/2017 |
| EP | 3186864 | A1 | 7/2017 |
| EP | 3230752 | A1 | 10/2017 |
| EP | 3274730 | A1 | 1/2018 |
| EP | 3306764 | A1 | 4/2018 |
| EP | 2264472 | B1 | 5/2018 |
| EP | 2270944 | B1 | 8/2018 |
| EP | 2838172 | B1 | 11/2018 |
| EP | 2860536 | B1 | 12/2018 |
| EP | 3185382 | B1 | 2/2019 |
| EP | 3180827 | B1 | 4/2019 |
| EP | 3295530 | B1 | 5/2019 |
| EP | 3295530 | B8 | 5/2019 |
| EP | 3499253 | A1 | 6/2019 |
| EP | 2472688 | B1 | 7/2019 |
| EP | 2942850 | B1 | 8/2019 |
| EP | 2808673 | B1 | 10/2019 |
| EP | 2424060 | B1 | 2/2020 |
| EP | 3471992 | B1 | 3/2020 |
| EP | 3644074 | A1 | 4/2020 |
| EP | 3182114 | B1 | 5/2020 |
| EP | 3076195 | B1 | 6/2020 |
| EP | 3674721 | A1 | 7/2020 |
| EP | 3674722 | A1 | 7/2020 |
| EP | 3361587 | B1 | 11/2020 |
| FR | 2926370 | A1 | 7/2009 |
| FR | 2914122 | B1 | 8/2009 |
| GB | 2477970 | A8 | 1/2012 |
| GB | 2530716 | A | 4/2016 |
| GB | 2557512 | B | 9/2018 |
| JP | 6246751 | B2 | 12/2017 |
| KR | 100996627 | B1 | 11/2010 |
| KR | 1020100129349 | A | 12/2010 |
| KR | 101542538 | B1 | 7/2015 |
| KR | 101549844 | B1 | 8/2015 |
| KR | 101723522 | B1 | 4/2017 |
| KR | 101889943 | B1 | 8/2018 |
| KR | 102049425 | B1 | 11/2019 |
| KR | 102096075 | B1 | 4/2020 |
| WO | 0221657 | A1 | 3/2002 |
| WO | 2018065568 | A1 | 4/2018 |
| WO | 2020069697 | A1 | 4/2020 |
| WO | 2020084022 | A1 | 4/2020 |
| WO | 2020174267 | A1 | 9/2020 |
| WO | 2020192921 | A1 | 10/2020 |

OTHER PUBLICATIONS

Extended European Search Report; Application No. 21182280.4; Completed: Dec. 16, 2021; Mailing Date: Jan. 4, 2022; 9 Pages.
IEC 60947-9-2 ED1; Low-voltage switchgear and controlgear—Part 9-2: Active arc-fault mitigation systems—Optical-based internal arc-detection and mitigation devices; 121 A/406/FDIS, IEC, 3, Rue De Varembe, PO Box 131, CH-1211 Geneva 20, Switzerland; Jan. 15, 2021; 87 Pages.
International Search Report and Written Opinion of the International Searching Authority; Application No. PCT/EP2022/063006; Completed: Sep. 7, 2022; Mailing Date: Sep. 15, 2022; 15 Pages.

\* cited by examiner

TESTING AN ARC DETECTING SYSTEM

TECHNICAL FIELD

The present disclosure generally relates to arc detecting systems. In particular, there is provided a testing arrangement for an arc detecting system, as well as a method and computer program product for testing an arc detecting system.

BACKGROUND

Optical detectors are known to be used in arc detecting systems for detecting electrical arcs in pieces of electric equipment such as in switchgears or electrical motors. One such optical detector is for instance known from EP 3306764.

Such arcs may be needed to be handled quickly, such as through the opening of a circuit breaker connected to the equipment. However, in order to be able to perform such countermeasures, it is important that the arc detecting system functions properly. There is thus a need for being able to test the arc detecting system for ensuring that it functions properly.

IEC 60947-9-2 ED1: "Low-voltage switchgear and controlgear—Part 9-2: Active arc-fault mitigation systems—Optical-based internal arc-detection and mitigation devices", International Electroctechnichal Commission, 2021, which document is a final draft of an international standard, discusses various tests that are performed on internal arc fault control devices in low voltage switchgear and controlgear assemblies.

KR 102049425 discloses a system for testing a detector. According to the document a testing signal of fixed length that is considerably longer than the length of a signal caused by an arc is used in order to determine that the detector functions properly while at the same time avoiding the triggering an arc detection.

CN 109842086 discloses a system for testing a detector where pulses of triangular shape and with a fixed duty cycle are used. A detector that is able to detect the luminance of a pulse when it changes linearly from a first to a second luminance level is then considered to be functional. The slope or amplitude change rate of a pulse is also analyzed with regard to linearity of the detector. However, there is still a need for improvement. It may for instance be of interest to provide increased flexibility in that detection should be possible for different realizations of the arc detecting system, where different parts of the system can be placed at different distances from each other.

SUMMARY

One object of the present disclosure is to provide a flexible testing of an arc detecting system.

This object is according to a first aspect achieved by a testing arrangement for an arc detecting system comprising at least one optical detector at a piece of electric equipment, where the testing arrangement comprises at least one light source and a testing unit, which testing unit is configured to:

controlling the light source to emit a test light to the optical detector with steps of increasing luminance starting from a minimum test level and continuing towards a maximum test level;

investigate if the optical detector detects the emitted test light; and determine that the arc detecting system is operational if the optical detector is able to detect the test light at any of the used test levels.

This object is according to a second aspect achieved by a method of testing an arc detecting system comprising at least one optical detector at a piece of electric equipment. The method is carried out by a testing unit of a testing arrangement and comprises:

controlling a light source to emit a test light to the optical detector with steps of increasing luminance starting from a minimum test level and continuing towards a maximum test level;

investigating if the optical detector detects the emitted test light; and determining that the arc detecting system is operational if the optical detector is able to detect the test light at any of the used test levels.

The object is according to a third aspect achieved by a computer program product for testing an arc detecting system comprising at least one optical detector at a piece of electric equipment, the computer program product comprising a data carrier with computer program code which when run by a processor implements a testing unit configured to:

control a light source to emit a test light to the optical detector with steps of increasing luminance starting from a minimum test level and continuing towards a maximum test level;

investigate if the optical detector detects the emitted test light; and determine that the arc detecting system is operational if the optical detector is able to detect the test light at any of the used test levels.

Furthermore, the light of each test level may be continuous.

Moreover, each test level may be generated through controlling the light source using a corresponding sequence of pulses, where each sequence of pulses causes the light emitting unit to emit light at a corresponding test level. The various test levels may additionally be provided through the generation of pulse width modulation pulses of varying duty cycles.

According to a first variation of the first aspect the testing unit is configured to discontinue the control of the light source to emit test light after the optical detector is found to be able to detect it.

According to a corresponding variation of the second aspect, the method comprises discontinuing the control of the light source to emit test light after the optical detector is found to be able to detect it.

Furthermore, the minimum test level and maximum test level may define a range of allowable test levels.

According to a second variation of the first aspect, the testing unit is further configured to determine that the arc detecting system is faulty in case the optical detector fails to detect test light at any of the test levels in the range of allowed test levels.

According to a corresponding variation of the second aspect, the method further comprises determining that the arc detecting system is faulty in case the optical detector fails to detect test light at any of the test levels in the range of allowable test levels.

It is additionally possible that there is ambient light surrounding the optical detector.

According to a third variation of the first aspect, the testing unit is further configured to determine that the test light can be discerned from the ambient light when investigating if the optical detector detects the test light.

According to a corresponding variation of the second aspect, the investigating if the optical detector detects the test light comprises determining that the test light can be discerned from the ambient light.

According to a fourth variation of the first aspect, the testing unit is further configured to determine a luminance level of the ambient light.

According to a corresponding variation of the second aspect, the method further comprises determining a luminance level of the ambient light.

According to a fifth variation of the first aspect, the testing unit is further configured to read light detected by the optical detector without using the light source when determining a luminance level of the ambient light.

According to a corresponding variation of the second aspect, the determining of a luminance level of the ambient light comprises reading light detected by the optical detector without using the light source.

According to a sixth variation of the first aspect, the testing unit is configured to determine that the test light can be discerned from the ambient light if a difference between an ambient light level and a luminance level of a combination of test light and ambient light is above a test light discerning threshold.

According to a corresponding variation of the second aspect, the determining that the test light can be discerned from the ambient light is made if a difference between an ambient light level and a luminance level of a combination of test light and ambient light is above a test light discerning threshold.

A certain luminance level of the combination of ambient light and test light may be the luminance level of light detected by the optical detector when the light source emits test light at a corresponding luminance level.

According to a seventh variation of the first aspect, the testing unit is configured to compare the luminance level of light detected by the optical detector with a safety threshold and determine that operation of the arc detecting system is jeopardized if the safety threshold is exceeded, which detected light is the combination of ambient light and test light.

According to a corresponding variation of the second aspect, the method further comprises comparing the luminance level of light detected by the optical detector with a safety threshold and determining that operation of the arc detection system is jeopardized if the safety threshold is exceeded, where the detected light is the combination of ambient light and test light.

According to an eighth variation of the first aspect, the testing unit is configured to compare the luminance level of light detected by the optical detector with an ambient light threshold and stop operation if the ambient light threshold is exceeded, which detected light is ambient light.

According to a corresponding variation of the second aspect, the method further comprises comparing the luminance level of light detected by the optical detector with an ambient light threshold and stop operation if the safety threshold is exceeded, where the detected light is ambient light.

The arc detecting system may additionally be configured to compare the level of luminance of light detected by the optical detector with an arc detecting threshold, which arc detecting threshold may be higher than the safety threshold. The arc detecting threshold may more particularly have a safety margin to the safety threshold.

According to a ninth variation of the first aspect, the testing unit, if detecting test light, is further configured to store the corresponding luminance level in a test result memory.

According to a corresponding variation of the second aspect, the method further comprises storing the corresponding luminance level in a test result memory if detecting test light.

According to a tenth variation of the first aspect, the testing arrangement further comprises a health investigating unit. In this case the testing unit is configured to perform the testing regularly in time at different testing occasions and to store the test results of different testing occasions in the test result memory, while the health investigating unit is configured to analyze the test results from different testing occasions and determine a time of maintenance based on the analysis.

According to a corresponding variation of the second aspect, the method further comprises performing, by the testing unit, the testing regularly in time at different testing occasions and storing the test results of different testing occasions in a test result memory as well as analyzing, in a health investigating unit, the test results from different testing occasions and determining, in the health investigating unit, a time of maintenance based on the analysis.

A first optical fibre and a second optical fibre may interconnect the testing unit and the first optical detector, where the first optical fibre may be used by the light source to emit test light and the second optical fibre may be used for conveying light detected by the first optical detector. The first optical fibre may be a part of the testing arrangement and the second optical fibre may be a part of the testing arrangement or the arc detecting system. The arc detecting system may also be a part of the testing arrangement. Thereby the testing arrangement may comprise the first optical fibre that interconnects the light source and the optical detector. It may additionally comprise the second optical fibre that interconnects the optical detector and the testing unit.

BRIEF DESCRIPTION OF THE DRAWINGS

Further details, advantages and aspects of the present disclosure will become apparent from the following embodiments taken in conjunction with the drawings, wherein.

DETAILED DESCRIPTION

Arc detection is an important aspect in a number of electric environments. One such environment is the environment of a switchgear.

Figures 1, 2:
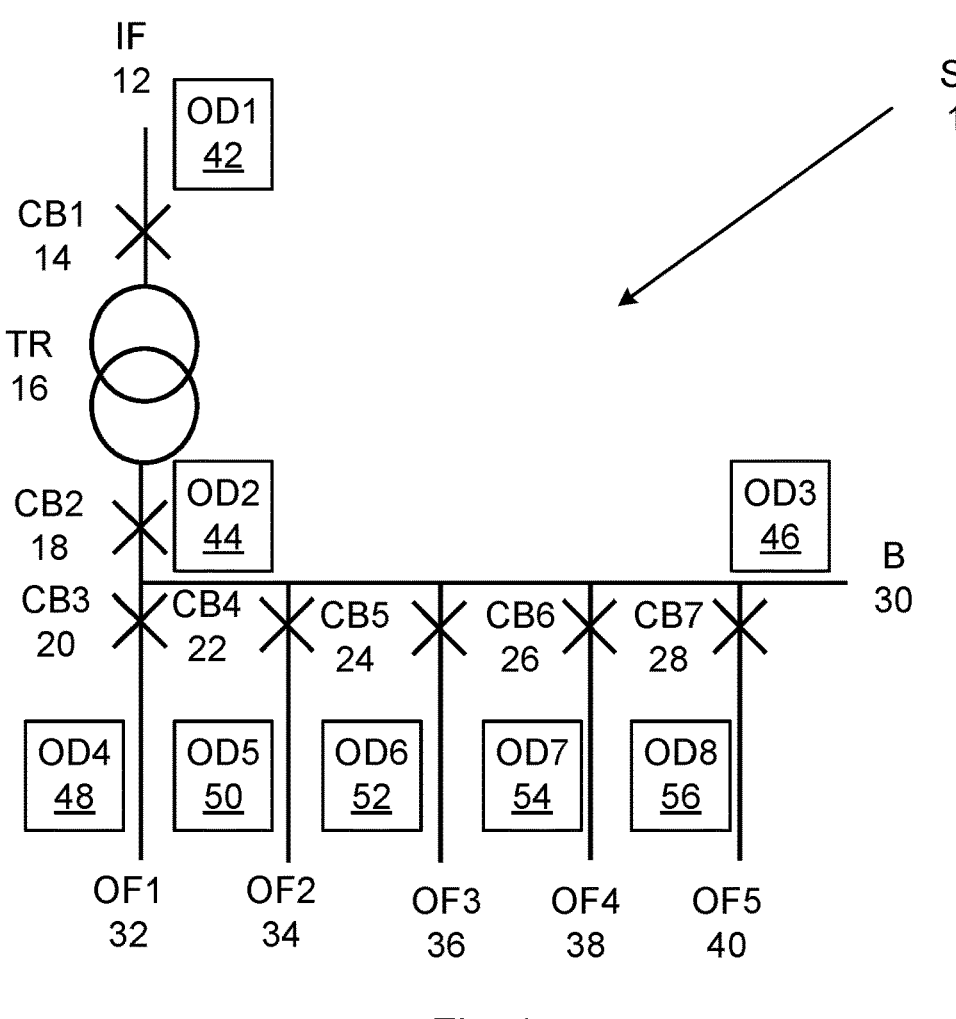
FIG. 1 schematically shows a switchgear around which a number of optical detectors of an arc detecting system have been placed.
FIG. 2 schematically shows a testing arrangement comprising a testing unit connected to a detection module as well as to an arc detector.

FIG. 1 schematically shows a switchgear SG 10 comprising an input feeder IF 12 connected to a primary winding of a transformer TR 16 via a first circuit breaker CB1 14. A secondary winding of the transformer 16 is connected to a busbar B 30 via a second circuit breaker CB2 18. A first output feeder OF1 32 is connected to the busbar 30 via a third circuit breaker CB3 20, a second output feeder OF2 34 is connected to the busbar 30 via a fourth circuit breaker CB4 22, a third output feeder OF3 36 is connected to the busbar 30 via a fifth circuit breaker CB5 24, a fourth output feeder OF4 38 is connected to the busbar 30 via a sixth circuit breaker CB6 26 and a fifth output feeder OF5 40 is connected to the busbar 30 via a seventh circuit breaker CB7 28.

In such a switchgear accidental arcs may occur that are detrimental. Such arcs may be detected using an arc detecting system comprising at least one optical detector. A circuit breaker may then be opened in order to protect the switchgear 10.

The opening of a circuit breaker typically leads to the generation of an arc. However, the arc detecting system is not provided for detecting such intentional arcs, but for detecting accidental arcs that can occur anywhere in the switchgear 10, such as because of accidental short-circuits. For this reason, a number of optical detectors may be placed around the switchgear 10. As an example a first optical detector OD1 42 is placed at the input feeder 12, a second optical detector OD2 44 is placed at the connection of the second circuit breaker 18 to the busbar 30, a third optical detector OD3 46 is placed at the connection of the seventh circuit breaker 28 to the busbar 30, a fourth optical detector OD4 48 is placed at the first output feeder 32, a fifth optical detector OD5 50 is placed at the second output feeder 34, a sixth optical detector OD6 52 is placed at the third output feeder 36, a seventh optical detector OD7 54 is placed at the fourth output feeder 38 and an eighth optical detector OD8 56 is placed at the fifth output feeder 40.

The number of optical detectors used, and their placing is merely exemplifying, and it is possible with more or fewer optical detectors as well as pacing at other locations.

It should also be realized that a switchgear is merely one example of a piece of electric equipment where arcs are of interest to be detected. Arc detection may for instance also be of interest in electric motors.

FIG. 2 schematically shows a testing arrangement TA 58. The testing arrangement comprises a testing unit TU 60 a detecting module DM 62 as well as an arc detector AD 70. The detecting module 62 comprises the first optical detector 42, a trip indicator 68 connected to the optical detector 42 as well as driver buffer DB 66 connected to a light source LS 64. The testing unit 60 sends test signal to the driver buffer 66, from where they are applied to the light source 64. The optical detector 42 in turn detects light and the detected light is supplied as a luminance level to the testing unit 60 as well as to the trip indicator 68.

The trip indicator 68 indicates that there is an arc to the arc detector 70 if the luminance level of the detected light exceeds an arc detecting threshold. For this reason the trip indicator 68 may be equipped with a luminance detector. The arc detector 70 then handles the arc in a suitable manner.

In FIG. 2, there is one detecting module 62. It should here be realized that it is possible that the testing unit 60 and arc detector 70 may be connected to several such detecting modules 62, where the number depends on the number of optical detectors that are used. It is likewise possible that units are not grouped into modules.

The testing unit 60, driver buffer 66 and the light source 64 are parts of the testing arrangement 58, while the optical detector 42, trip indicator 68 and arc detector 70 are parts of the arc detecting system. It should be realized that it is possible that also the arc detecting system is part of the testing arrangement 58.

Figure 3:
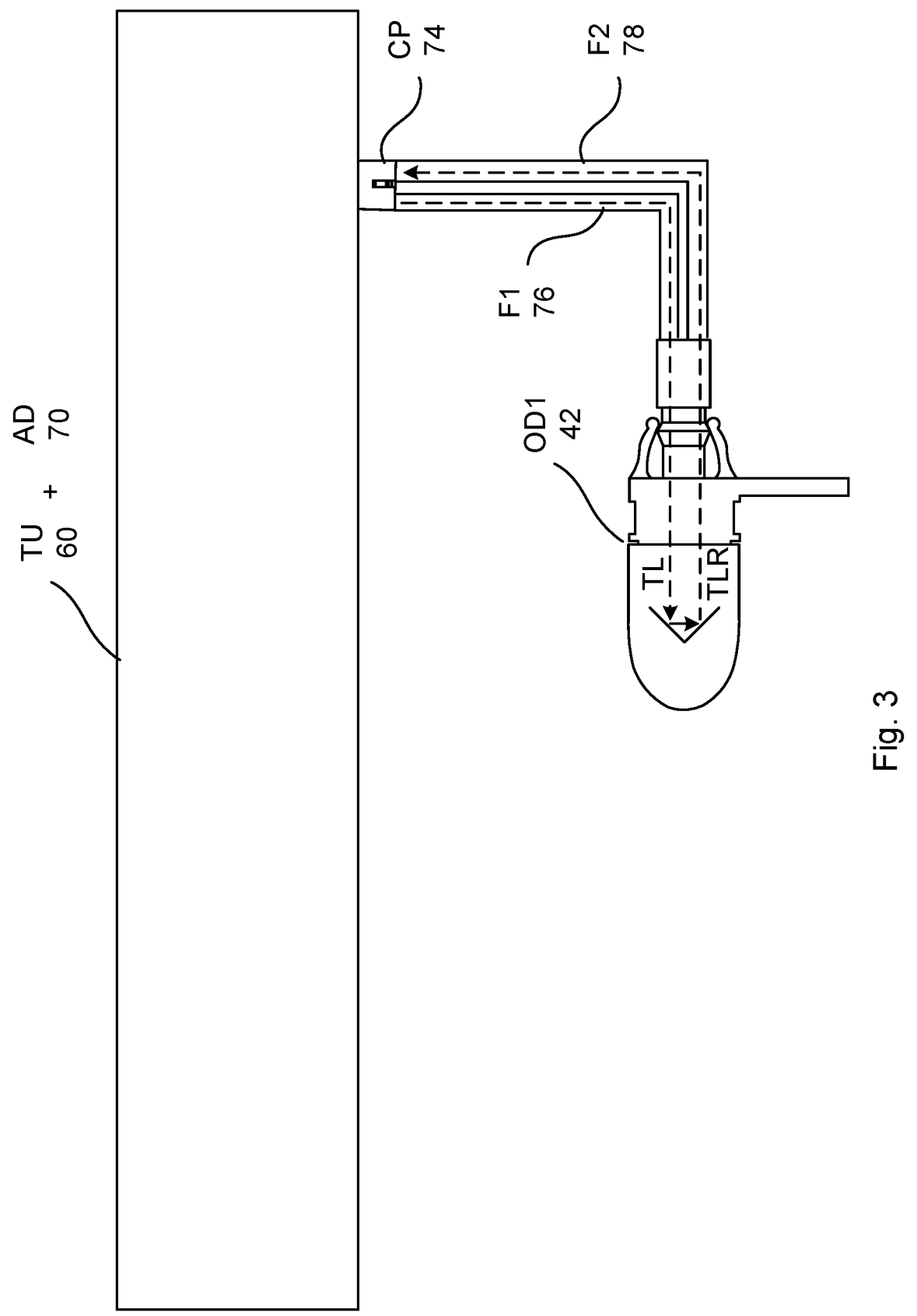
FIG. 3 schematically shows the testing unit connected to a first optical detector via a first and a second optical fibre.

FIG. 3 schematically shows another way of connecting the testing unit 60 to the first optical detector 42. A combined testing unit 60 and arc detector 70 may have a connection port 74 via which it is connected to the first optical detector 42 using a first optical fibre F1 76 and a second optical fibre F2 78. The testing unit 60 emits test light TL to the first optical detector 42 via the first fibre 76. The connection port 74 may for this reason comprise the light source, for instance in the form of a light emitting diode (LED) which emits the test light TI into the first optical fibre 76. The test light TL is then conveyed to the first optical detector 42 via the first fibre 76. The optical detector 42, which may be detector as outlined in EP 3306764, comprises a prism that reflects the test light TL back to the connection port 74 of the testing unit 60 via the second optical fibre 78 in the form returned test light TLR. The connection port 74 may also comprises a luminance detector for detecting the luminance of the returned test light TLR as well as the trip indicator for supplying a trip indication to the arc detector 70. It can thereby be seen that the first optical fibre 76 interconnects the light source and the optical detector 42 and that the second optical fibre 78 interconnects the optical detector 42 and the testing unit 60.

It may be important to test the optical detectors to ensure that they operate satisfactorily. It is therefore of interest to emit test light and investigate if this test light can be detected. Moreover, it is possible that the luminance level at which test light is detected varies between different optical detectors. It is for instance possible that the optical detectors have different sensitivities. It is also possible that the rest of the arc detecting system influences these levels. It is for instance possible that the fibre length and fibre type influences the level.

There is therefore a need for a flexible way of testing that allows an optical detector to be safely tested despite different possible variations in the arc detecting system.

Figure 4:
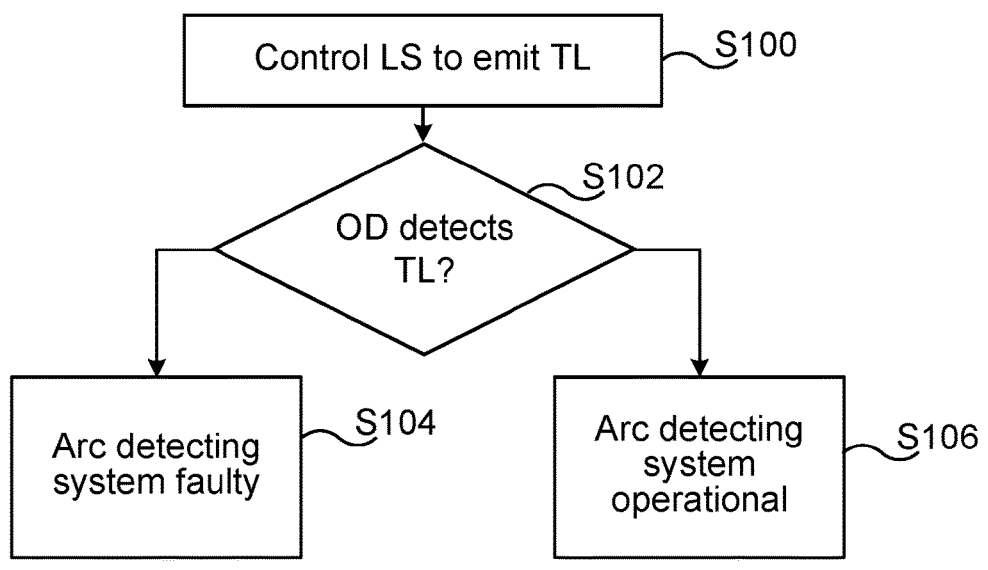
FIG. 4 shows a number of method steps in a method of testing an arc detecting system according to a first embodiment.

How this may be addressed will now be described for the first optical detector 42 in relation to a first embodiment, where the operation of this first embodiment will be described with reference being made to FIG. 4, which shows a number of method steps being performed by the testing unit 60.

The testing unit 60 controls the light source 64 to emit test light TL to the first optical detector 42, S100, where the test light TL is emitted with steps of increasing luminance starting from a minimum test level and continuing towards a maximum test level, where the minimum test level and maximum test level define a range of allowable test levels. The light of each test level may be continuous. This means that the light source 64 may emit continuous test light at the minimum test level and then continue with continuous test light at each of the investigated steps towards the maximum test level. Each test level may additionally be generated through controlling the light source using a corresponding sequence of pulses, where each sequence of pulses causes the light emitting unit to emit light at a corresponding test level. The light source may thus be controlled to generate test light at the minimum test level using a first sequence of pulses, at a first higher level using a second sequence of pulses etc. The various test levels may additionally be provided through the generation of pulse width modulation pulses of varying duty cycles. The test light TL may thus be transmitted using pulse width modulation (PWM) or pulse duration modulation (PDM). The test levels may as an example be provided through varying the duty cycle of the PWM pulses, where the lowest duty cycle is used for the lowest or minimum test level and the highest duty cycle is used for the highest or maximum test level. The step size may as an example be equal. There may thus be a steady increase of luminance from luminance level to luminance level. Alternatively, the step size may double, triple or quadruple from one step to another.

This test light TL is emitted to the first optical detector 42 via the first fibre 76 and the light source 64. The testing unit 60 investigates if the first optical detector 42 detects this test light TL.

For this reason the testing unit 60 monitors the light TLR that is returned from the first optical detector 42 via the second fibre 78 and the luminance detector in the connection port 74, where the returned light TLR is light detected by the first optical detector 42.

When investigating if the test light is detected, the testing unit 60 may investigate that light as such is detected. It may additionally detect the luminance level of any detected light TLR, where the presence of detected light when test light is emitted may be considered to be the detection of the test light. As an alternative, the detection of a luminance level that corresponds to a test light luminance level may be considered as detection of test light.

If now the testing unit 60 finds that the first optical detector 42 is able to detect the test light TL from any of the test levels in the range of allowable test levels, S102, then the arc detecting system is deemed operational, S106. It is in this case possible that control of the light source to emit test light is discontinued after such a determination. It is thus possible that remaining luminance levels in the range of allowable test levels are not used after the ability to detect test light has been determined. However, in case the first optical detector 42 is deemed not to be able to detect the test light TL using any of the luminance levels of the test light TL, S102, then the arc detecting system is deemed to be faulty, S104, and the testing unit 60 may perform some kind of protective measure, such as generate a warning to an operator.

It can be seen that the correct function of the first optical detector 42 can be verified for a variety of luminance levels as long as they are in the range of allowable test levels. Thereby the testing arrangement is versatile and can be used in different arc detecting environments.

The first optical detector may be placed in an environment where there is ambient light. In this case this ambient light may have to be considered when determining if the arc detecting system functions satisfactorily or not. It may be of interest to determine if the test light can be discerned from the ambient light as well as to determine that the combination of ambient light and test light is below a safety threshold in order to ensure that test light is not mistaken for an arc.

Figure 5:
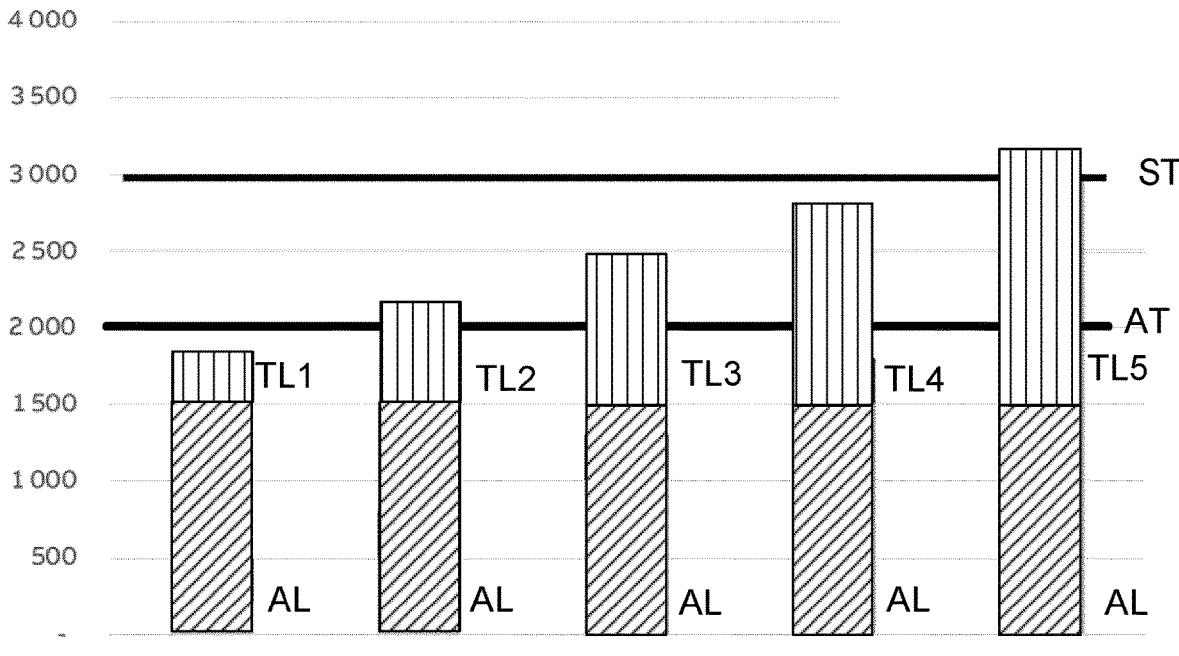
FIG. 5 shows detected ambient and test light levels together with a safety threshold.

FIG. 5 shows the luminance of a first emitted ray of test light TL1 at a first luminance level together with the luminance of ambient light AL at an ambient light level, the luminance of a second emitted ray of test light TL2 at a second luminance level together with the luminance of ambient light AL at the ambient light level, the luminance of a third emitted ray of test light TL3 at a third luminance level together with the luminance of ambient light AL at the ambient light level, the luminance of a fourth emitted ray of test light TL4 at a fourth luminance level together with the luminance of ambient light AL at the ambient light level and the luminance of a fifth emitted ray of test light TL5 at a fifth luminance level together with the luminance of ambient light AL at the ambient light level. The test light luminances TL1, TL2, TL3, TL4 and TL5 are examples of different test light levels that can be used. It should be realized that several more levels are possible. There is also a safety threshold ST as well as an ambient light threshold AT.

The luminance detected by the optical detector is the combined luminance of the test light and the ambient light. The optical detector more particularly detects the sum of these luminances. It can be seen that as the luminance of the test light is increased with every step, the total luminance detected by the first optical detector increases until it passes the safety threshold ST. The previously mentioned arc detecting threshold may be set higher than this safety threshold ST and with advantage have a safety margin to the safety threshold ST. In this case safety threshold can be used to ensure that the testing does not trigger arc detection.

The ambient light threshold AT may in turn be used to determine that there is not too much ambient light. The exceeding of the ambient light threshold AT may be an indication that the door of a cabinet where the switchgear is placed is open.

Figure 6:
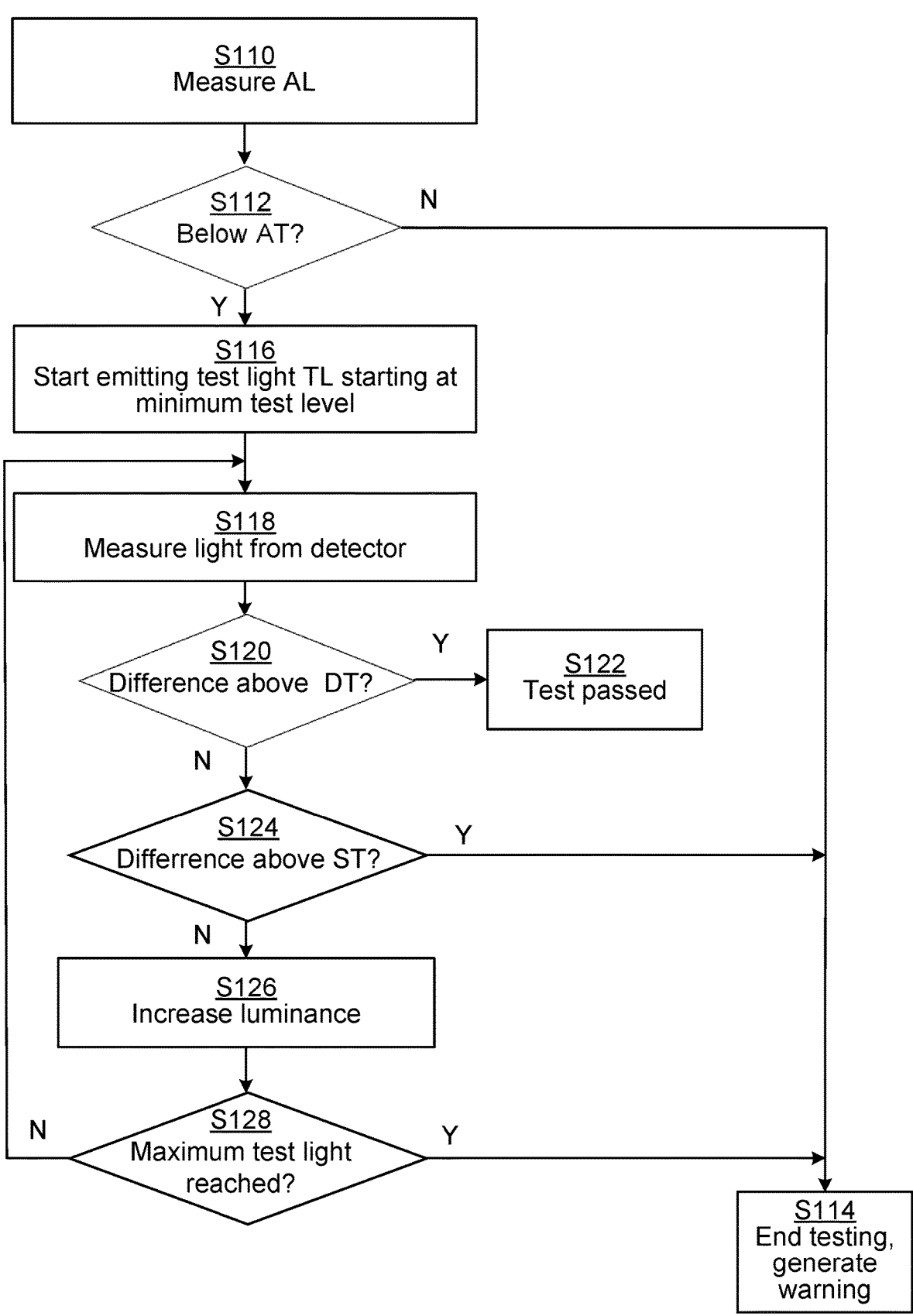
FIG. 6 shows a number of method steps in a method of testing an arc detecting system according to a second embodiment.

Now a second embodiment will be described with reference also being made to FIG. 6, which shows a flow chart of a number of steps being performed by the testing unit 60. In the second embodiment both ambient light consideration and arc detection avoidance is performed The testing unit 60 first measures the ambient light AL, S110, which is done without the emitting of any test light. In this case the testing unit 60 determines a luminance level of the ambient light AL, which is done through reading the light detected by the first optical detector 42 without using the light source 42. The light being detected by the optical detector 42 is then the ambient light AL. The testing unit 60 then compares the luminance level of light detected by the first optical detector 42 with the ambient light threshold AT. The testing unit 60 then investigates if the luminance of the ambient light AL is above or below the ambient light threshold AT.

If the ambient light is above the ambient light threshold AT, S112, the testing unit 60 ends testing and generates a warning, S114, which warning may be a warning that the luminance of the ambient light is too high because the luminance of the ambient light exceeds the ambient light threshold AT.

However, in case the ambient light AL is below the ambient light threshold AT, S112, the testing unit 60 starts to emit test light TL at the minimum test level, S116, where PWM pulse generation may be used. The minimum test level may in this case correspond to a lowest PWM duty cycle. The testing unit 60 thus controls the light source 64 to emit a test light TL to the optical detector 42 and starts with the minimum test level.

The testing unit 60 then measures the returned light TLR from the first optical detector 42, S118, which light comprises a combination of test light TL and ambient light AL. It may for instance be the combination of the first ray of test light TL1 and ambient light AL.

The testing unit 60 investigates if the test light can be detected, which in this case involves investigating if it is possible to discern the test light from the ambient light. This may be done through investigating the difference between the luminance level of the detected light and the luminance level of the ambient light, where the detected light is the combination of ambient light and test light. Thereby the luminance level of the combination of ambient light and test light is the luminance level of light detected by the optical detector when the light source emits test light at a corresponding luminance level. The investigating may additionally involve investigating if the above-mentioned difference is above or below a test light discerning threshold DT or minimum detection limit. The testing unit 60 may thus determine that the test light TL can be discerned from the ambient light AL if a difference between an ambient light level and a luminance level of a combination of test light and ambient light is above the test light discerning threshold DT.

If the test light can be discerned from the ambient light, S120, then the testing unit 60 stops the testing and indicates that the test is passed, S122, i.e. that the arc detecting system is functional. The aborting of the testing may here involve discontinuing the control of the light source to emit test light after the first optical detector 42 is found to be able to detect it. The testing unit 60 may additionally store the luminance level of the detected test light in a test result memory.

However, if the difference between the detected light and the ambient light was not over the test light discerning threshold or minimum detection limit, S120, the testing unit 60 continues and investigates if the detected level is above or below the safety threshold ST, S124.

In case the detected light is above the safety threshold, S124, i.e., the luminance level of the combination of ambient light and test light is above the safety threshold ST, the testing unit 60 aborts the testing and generates a warning, S114, where the warning in this case is a warning that the luminance level of the detected light is too high.

In case the detected light is below the safety threshold ST, S124, the testing unit 60 goes on and continues testing at the next test level. It thus increases the luminance to the next luminance level, S126, which again may involve increasing the PWM duty cycle. Thereafter the testing unit 60 investigates if the luminance of the test light is at the maximum luminance level, which in this case may correspond to the highest duty cycle.

In case the luminance of the test light is above or at the maximum level, S128, the testing unit aborts operation and may additionally issue a warning, S114, where the warning in this case is that the testing has failed.

However, in case the end of the range has not been reached, S128, the testing unit 60 repeats measuring the detected light, S118, and then investigates if the test light can be detected.

It thereafter continues in the same way until either test light that is discernible from the ambient light is detected, the maximum luminance level of the test light is reached or the safety threshold ST is crossed.

The discerning of test light from the ambient light thus leads to a determination that the arc detecting system is operational or functional, where the use of a range of values provides flexibility in the detection level. If ambient light is detected but no test light can be found, this is an indication of a possible faulty first fibre. If no ambient light or no test light is detected, then there is a possible fault on the second fibre, while the exceeding of the safety threshold is a warning that an arc may be erroneously detected by the arc detector.

The above described operation may be continuously performed when the switchgear is in operation. Thereby the correct functioning of the arc detecting system may be continuously monitored and the failure to detect test light indicated as soon as this failure is detected, which increases the reliability of the arc detecting system.

As can be seen above, the testing may be periodically carried out at recurring testing occasions. This may be advantageous also in other situations.

Figure 7:
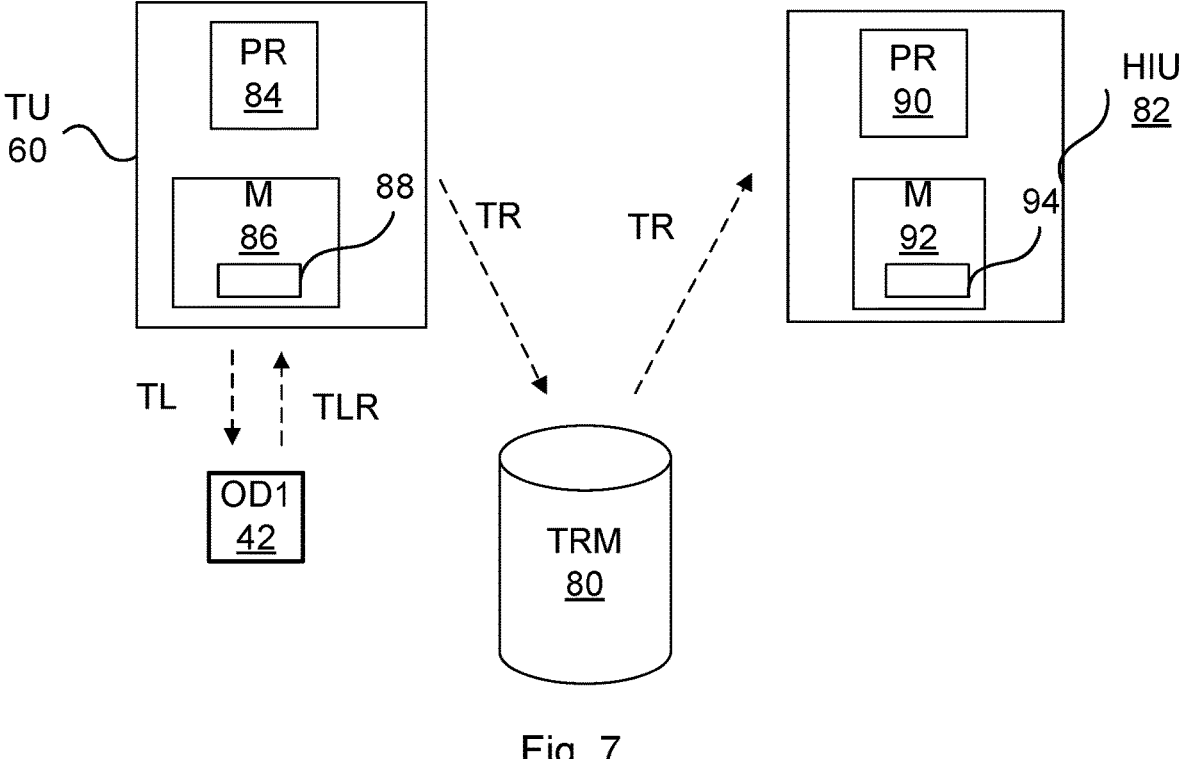
FIG. 7 schematically shows the testing unit and first optical detector together with a test result memory and a health investigating unit.

FIG. 7 schematically shows the testing unit 60 together with the first optical detector 42, a testing result memory TRM 80 and a health investigating unit HIU 82, where the testing unit 60 may be realized through a processor 84 acting on computer instructions 88 in a computer program memory 86. The testing unit 60 may as an example be realized as a microcontroller. The health investigating unit 82 may also be realized as a processor 90 acting on computer instructions 94 in a computer program memory 92. It is also possible that the testing unit and health investigating unit is provided by the same processor and computer instructions.

The testing unit 60 may perform the testing regularly in time at different testing occasions, where one run through a testing cycle in the allowed testing range may make up one such testing occasion. The testing unit may thereby store the test results TR of different testing occasions in the test result memory 80. The health investigating unit 82 may then analyze the test results TR from different testing occasions and determine a time of maintenance based on the analysis. The testing unit 60 may thus continuously save the results of the tests performed during the testing occasions in the test result memory 80. The health investigating unit 82 may then investigate if the test results show a change in the luminance levels at which the test light is detected. A change in this level over time for the same optical detector operating at the same ambient light conditions may be used as an indication of wear of an optical detector one or two of the optical fibres or all these elements. This information can be used to determine when maintenance is to be made.

The testing unit as well as the health investigating unit were each implemented in the form of one or more processors together with computer program code implementing the functionality. As an alternative it is possible that the units may be implemented as dedicated hardware, such as through a complex programmable logic device (CPLD), a field-programmable gate array (FPGA) or an application-specific integrated circuit (ASIC) Also the arc detector may have such a realization.

Figure 8:
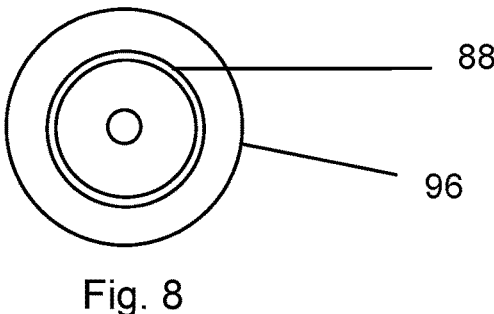
FIG. 8 schematically shows a computer program product in the form of a CD ROM disc with computer program code for implementing the testing unit.

The functionality of the testing unit may also be provided as a computer program product comprising a data carrier with computer program code implementing the above-mentioned functionality when being run by a processor. One such data carrier in the form of a CD ROM disk 96 with computer program code 88 is schematically shown in FIG. 8.

While the present disclosure has been described with reference to exemplary embodiments, it will be appreciated that the present invention is not limited to what has been described above.

The invention claimed is:

1. A testing arrangement for an arc detecting system comprising at least one optical detector at a piece of electric equipment, the testing arrangement having at least one light source and a testing unit, said testing unit being configured to:

control the at least one light source to emit a test light to the optical detector with steps of increasing luminance starting from a minimum test level and continuing towards a maximum test level, wherein the test light of each test level is continuous and each test level is generated through controlling the at least one light source using a corresponding sequence of pulses, each sequence of pulses causing the at least one light source to emit light at a corresponding test level;

investigate if the optical detector detects the emitted test light; and determine that the arc detecting system is operational if the optical detector is able to detect the test light at any of the used test levels.

2. The testing arrangement according to claim 1, wherein the various test levels are provided through the generation of pulse width modulation pulses of varying duty cycles.

3. The testing arrangement according to claim 1, further comprising a first optical fibre interconnecting the at least one light source and the optical detector.

4. The testing arrangement according to claim 3, further comprising a second optical fibre interconnecting the optical detector and the testing unit.

5. The testing arrangement according to claim 1, wherein the minimum test level and maximum test level define a range of allowable test levels and the testing unit is configured to determine that the arc detecting system is faulty in case the optical detector fails to detect test light at any of the test levels in the range of allowed test levels.

6. The testing arrangement according to claim 1, wherein there is ambient light surrounding the optical detector and the testing unit, when investigating if the optical detector detects the test light is configured to determine that the test light can be discerned from the ambient light.

7. The testing arrangement according to claim 6, wherein the testing unit is configured to determine that the test light can be discerned from the ambient light if a difference between an ambient light level and a luminance level of a combination of test light and ambient light is above a test light discerning threshold.

8. The testing arrangement according to claim 6, wherein the testing unit is configured to compare the luminance level of light detected by the optical detector with a safety threshold and determine that operation of the arc detecting system is jeopardized if the safety threshold is exceeded, wherein the light detected by the optical detector is a combination of ambient light and test light.

9. The testing arrangement according to claim 6, wherein the testing unit is configured to compare the luminance level of light detected by the optical detector with an ambient light threshold and stop operation if the ambient light threshold is exceeded, wherein the light detected by the optical detector is ambient light.

10. The testing arrangement according to claim 1, further comprising a health investigating unit, wherein the testing unit is configured to perform the testing regularly in time at different testing occasions and to store the test results of different testing occasions in a test result memory and the health investigating unit is configured to analyze the test results from different testing occasions and determine a time of maintenance based on the analysis.

11. The testing arrangement according to claim 1, further comprising the arc detecting system.

12. A method of testing an arc detecting system comprising at least one optical detector at a piece of electric equipment, the method being carried out by a testing unit of a testing arrangement and including:

controlling a light source to emit a test light to the optical detector with steps of increasing luminance starting from a minimum test level and continuing towards a maximum test level, wherein the test light of each test level is continuous and each test level is generated through controlling the light source using a corresponding sequence of pulses, each sequence of pulses causing the light source to emit light at a corresponding test level;

investigating if the optical detector detects the emitted test light; and determining that the arc detecting system is operational if the optical detector is able to detect the test light at any of the used test levels.

13. The method according to claim 12, where the minimum test level and maximum test level define a range of allowable test levels and further comprising determining that the arc detecting system is faulty in case the optical detector fails to detect test light at any of the test levels in the range of allowable test levels.

14. The method according to claim 12, wherein there is ambient light surrounding the optical detector and the investigating if the optical detector detects the test light includes determining that the test light can be discerned from the ambient light.

15. The method according to claim 14, further comprising comparing the luminance level of light detected by the optical detector with a safety threshold and determining that operation of the arc detection system is jeopardized if the safety threshold is exceeded, wherein the light detected by the optical detector is a combination of ambient light and test light.

16. The method according to claim 15, further comprising comparing the luminance level of light detected by the optical detector with an ambient light threshold and stopping operation if the ambient light threshold is exceeded, wherein the light detected by the optical detector is ambient light.

17. A computer program product for testing an arc detecting system which includes at least one optical detector at a piece of electric equipment, the computer program product comprising a non-transitory data carrier with computer program code which when run by a processor implements a testing unit configured to;

control a light source to emit a test light to the optical detector with steps of increasing luminance starting from a minimum test level and continuing towards a maximum test level, wherein the test light of each test level is continuous and each test level is generated through controlling the light source using a corresponding sequence of pulses, each sequence of pulses causing the light source to emit light at a corresponding test level;

investigate if the optical detector detects the emitted test light; and determine that the arc detecting system is operational if the optical detector is able to detect the test light at any of the used test levels.

* * * * *